United States Patent [19]

Folmer

[11] Patent Number: 5,436,596
[45] Date of Patent: Jul. 25, 1995

[54] PLL WITH STABLE PHASE DISCRIMINATOR

[75] Inventor: Lambert J. H. Folmer, Hausen am Albis, Switzerland

[73] Assignee: U.S. Philips Corporation, New York, N.Y.

[21] Appl. No.: 153,384

[22] Filed: Nov. 16, 1993

[30] Foreign Application Priority Data

Nov. 18, 1992 [EP] European Pat. Off. ............ 92203549

[51] Int. Cl.[6] ........................ H03L 7/00; H03L 7/089
[52] U.S. Cl. .................................... 331/1 A; 331/25; 331/18; 327/2; 327/3; 327/7; 327/12
[58] Field of Search ................ 328/155; 331/1 A, 25, 331/27; 327/2, 3, 12, 7, 141, 147, 156, 159

[56] References Cited

U.S. PATENT DOCUMENTS

| | | | |
|---|---|---|---|
| 4,105,947 | 8/1978 | Crowley | 331/1 A |
| 4,814,726 | 3/1989 | Byrd et al. | 331/27 |
| 5,124,594 | 6/1992 | Numata et al. | 307/528 |

FOREIGN PATENT DOCUMENTS 3813550 2/1989 Germany .
2021724 9/1988 Japan .

OTHER PUBLICATIONS

Search Report.

*Primary Examiner*—Robert J. Pascal
*Assistant Examiner*—Arnold Kinkead
*Attorney, Agent, or Firm*—Bernard Franzblau

[57] ABSTRACT

A phase-locked-loop (PLL) with stable phase discrimination includes a charge pump with a current source and current sink to control a VCO, and a phase discriminator to compare the VCO's signal to a stable reference signal for controlling the charge pump. The phase discriminator includes a resettable D-flipflop to provide the current source control signal and a resettable D-flipflop to provide the current sink control signal. The reset signal keeps both sink and source temporarily alive to avoid a dead zone region. The reset signal is produced under the combined control of the sink and source control signals and, in addition, of the reference signal to enhance stability.

19 Claims, 2 Drawing Sheets

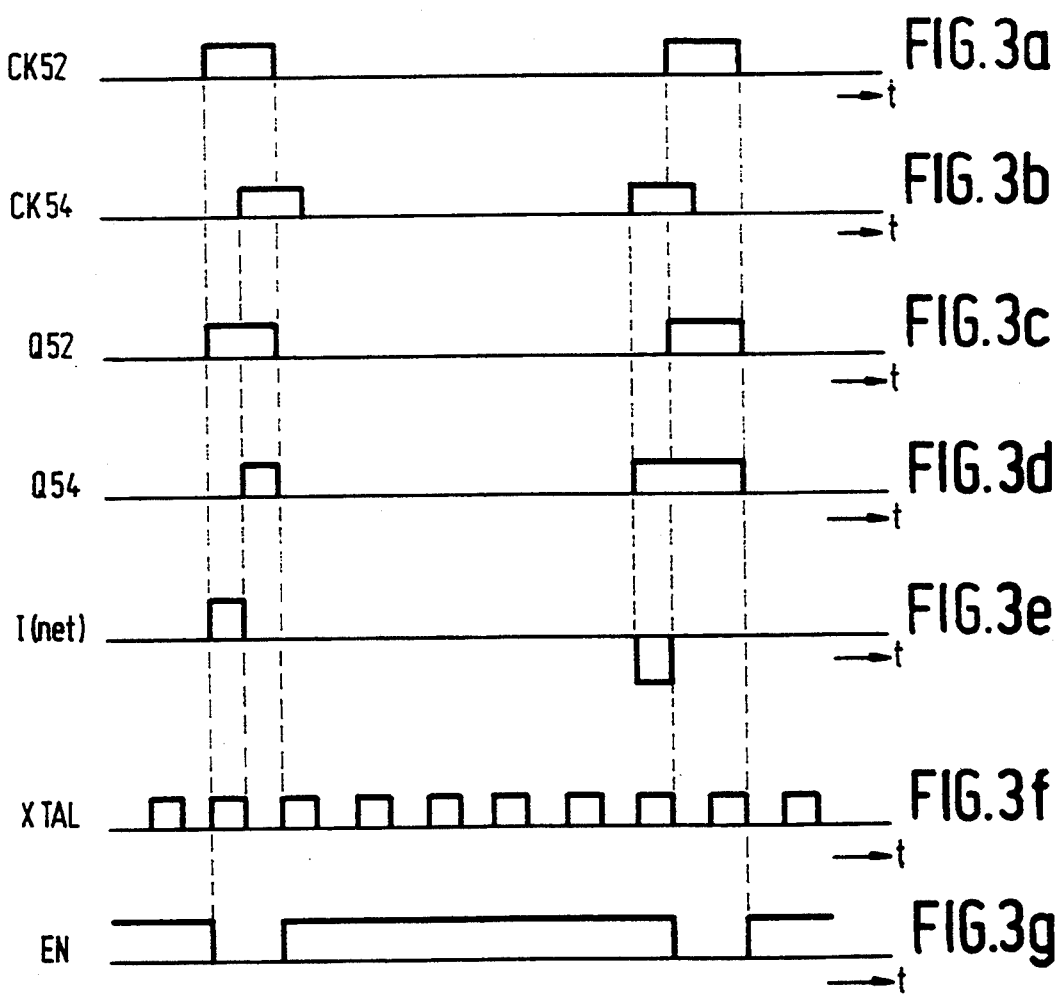

5,436,596

PLL WITH STABLE PHASE DISCRIMINATOR

FIELD OF THE INVENTION

BACKGROUND OF THE INVENTION

This invention relates to an electronic circuit with a PLL (phase-locked-loop) comprising a VCO (voltage-controlled-oscillator), a charge pump and a phase discriminator. The VCO has an oscillator output for supplying an oscillator output signal and a control input for control of the VCO. The charge pump has a current source and a current sink and provides a control signal to the VCO control input. The phase discriminator has a first detector input to receive the oscillator output signal and a second detector input to receive a reference signal. The phase discriminator controls the charge pump in dependence on a phase difference between the oscillator output signal and the reference signal. The phase discriminator includes resettable latch means that is responsive to the oscillator output signal and the reference signal to supply a source signal for control of the current source and a sink signal for control of the current sink. The phase discriminator further includes reset means to generate a reset signal for resetting the latch means upon both the current sink and the current source being kept turned on for a particular time span. The generation of the reset signal involves the sink signal and the source signal.

BACKGROUND ART

PLLs are widely used for, e.g., synchronizing an oscillator, typically a voltage-controlled oscillator (VCO), to a reference frequency, building a synthesizer to produce a plurality of signals with stable frequencies out of a reference signal with a highly stable reference, building active filters, detecting FM signals, etc.

The control signal provided by a typical digital phase discriminator, used to control a VCO, has one polarity in case a phase lag is detected and the other polarity when a phase lead is detected. For very small phase differences, in the transition from one polarity to the other polarity, there is often a dead zone region where the control signal is insensitive to phase-difference changes. However, it is very important that the control characteristic of the PLL be linear in a phase-difference interval that contains the zero-phase-error working point to avoid the VCO uncontrollably changing its phase. The VCO's undesired phase change gives rise to the so-called dead band range wherein the VCO's eventual output signal is unpredictable and is liable to dither. Such a dead zone region may stem from, for instance, a delay between the charge pump's current source being turned on and the charge pump's current sink being turned off and vice versa.

Prior art document U.S. Pat. No. 4,814,726 discloses a digital PLL of the kind described above. In order to ensure that there is no appreciable dead band range in the prior art device, both the pump's current sink and current source are kept active in the vicinity of the zero-phase-difference working point without producing a net charge variation at the pump's output. The result is an operation substantially linearly sensitive to a wide range of phase-difference values.

The known PLL comprises first and second latches. At each phase-comparison operation, the first latch stores the reference signal value and supplies the source signal for the current source, and the second latch stores the VCO's signal, after frequency division, to provide the sink signal. Both signals are kept alive for a predetermined delay by using a first logic gate that has first and second inputs coupled to the current source and the current sink, respectively. The first logic gate senses whether or not the current sink and the current source are both turned on. The first logic gate has an output connected to an input of a second logic gate that has two other inputs, one connected to the first latch and the other to the second latch. The second logic gate produces a reset signal, determined by the logic values stored in the latches and delivered by the first logic gate, to reset the latches for the next phase comparison operation. The length of the reset delay is determined by the delays of the logic gates and the pump's elements.

In the prior art device, the characteristics of the charge pump's components and of the logic gates in the reset path determine the moment of resetting the phase discriminator. This still introduces dependencies on process parameters, design features and temperature, adversely affecting stability.

OBJECT OF THE INVENTION

It is therefore an object of the invention to provide an electronic device as specified in the preamble, whose dependence on process parameter spread, design features and temperature is reduced and which is more accurately controllable than the prior art device.

SUMMARY OF THE INVENTION

To this end, the invention provides an electronic circuit of the kind specified in the preamble, characterized in that the reset means is operative to produce the reset signal under combined control of the sink signal and source signal and the reference signal.

Both current sink and current source are kept temporarily alive to avoid a dead zone region. The reset signal is produced under combined control of the sink and source control signals and, in addition, of the reference signal to enhance stability. The invention is based on the insight that the reference signal usually is a highly stable signal against which the other signals are measured, thus providing a well defined time frame, possibly after appropriate frequency division of one or both said signals, for example, when the reference signal is supplied by a crystal oscillator. Therefore, the time period between two successive edges of the same or the opposite polarity in the reference signal provides a favourable base to control the resetting of the latch means. If the two edges are a pair of successive upgoing or downgoing edges, the reset is delayed for at the most one cycle of the reference signal. If the two edges are two successive transitions in the reference signal, the effect is a maximum delay of half a cycle. The latter option has the advantage that less noise is generated and accumulated at the pump's output, and that power consumption, due to both the sink and the source being turned on, is reduced.

Note that the operation of the circuit of the invention can be tested more easily than the prior art circuit since the reset means functions independently of the charge pump.

In an embodiment of the invention, the phase discriminator comprises a logic gate and first and second resettable D-tiptops, each with a clock input, a data input, a reset input and an output. The data inputs of the D-tiptops are connected to a node for receiving adc voltage, e.g., the supply voltage Vcc. The clock input of the first D-tiptop receives the reference signal, and the clock input of the second D-flipflop receives the oscillator output signal. The output of the first D-tiptop provides a signal to activate one of the current source and current sink, whereas the output of the second D-flipflop provides a signal to activate the other one of the current source and current sink. The logic gate has a first gate input coupled to the output of the first D-flipflop, a second gate input coupled to the output of the second D-flipflop, and a third gate input to receive a further signal representative of the reference signal. A gate output of the logic gate is connected to the reset input of both the first and second D-flipflops.

This embodiment is highly simplified with respect to the apparatus of the prior art. Fewer components are needed, resulting in a reduced accumulation of noise effects within the PLL. The reference signal, typically derived from a stable source such as a crystal oscillator, ensures highly accurate operation independent of operational parameters of a dedicated feed-back loop as in the prior art.

BRIEF DESCRIPTION OF THE DRAWING

The invention will be explained below, by way of example, and with reference to the accompanying drawing, wherein:

FIGS. 3a-3g provides signal diagrams to clarify the operation of the discriminator in FIG. 2.

DETAILED DESCRIPTION OF THE EMBODIMENTS

General PLL

Figure 1:
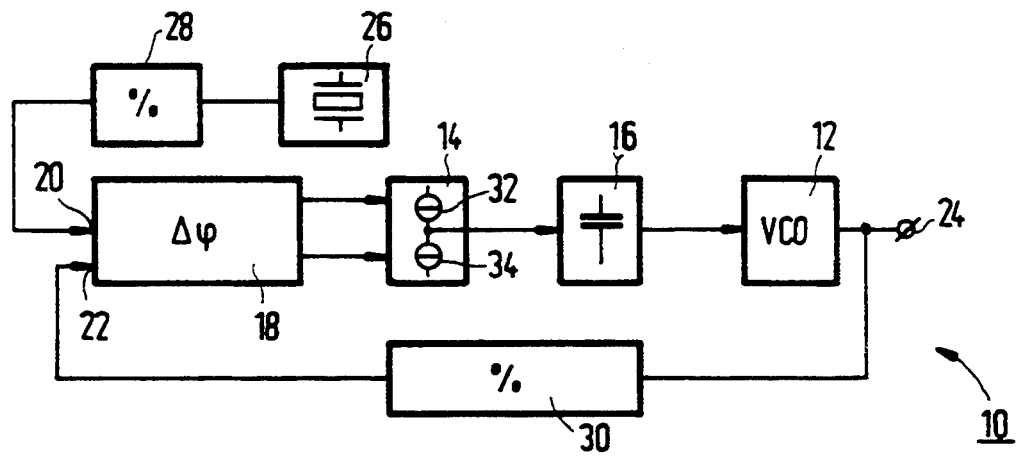
FIG. 1 shows a block diagram of a typical PLL.

FIG. 1 is a block diagram of a typical PLL 10. PLL 10 comprises a VCO 12 whose oscillation frequency is controlled through a charge pump 14 via a filter 16. Filter 16 substantially is a capacitance to be charged or discharged to supply the control voltage to a control input of VCO 12. Charge pump 14 in turn is controlled by a phase discriminator 18 that mutually correlates a reference signal at an input 20 and a further signal at an input 22 that is indicative of an output signal of VCO 12 at an output 24. The reference signal is derived from a stable oscillator 26, such as a crystal oscillator, either directly or via a divider 28. The further signal may be the VCO's output signal at output 24 or may be derived from the VCO's output signal via a divider 30.

As known, PLL 10 serves to keep the frequency of the signal supplied to input 22 substantially identical to the frequency of the reference signal at input 20. Charge pump 14 basically comprises a current source 32 and a current sink 34. The appropriate control voltage to VCO 12 at the capacitance in filter 16 is produced under control of current source 32 and current sink 34, which in turn are supervised by phase discriminator 18.

As already mentioned above, in order to have PLL 10 operate properly, phase discriminator 18 and pump 14 should collaborate to avoid the dead band around zero-phase error due to non-linearities in the response. This is accomplished by keeping both source 32 and sink 34 turned on in the zero-difference region, without producing a net charge increase or decrease at the pump's output.

Phase discriminator

Figure 2:
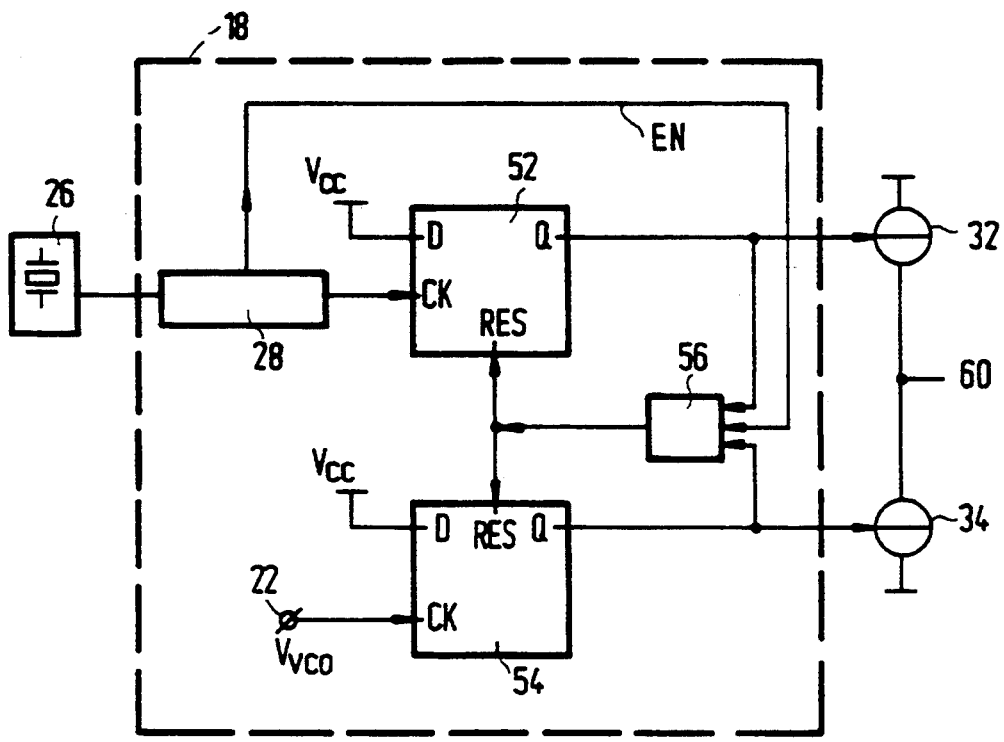
FIG. 2 shows a block diagram of a phase discriminator in accordance with the invention.

FIG. 2 shows a phase discriminator 18 according to the invention. Phase discriminator 18 comprises first and second resettable D-tiptops, 52 and 54, each with a clock input CK, a data input D, a reset input RES and an output Q. Discriminator 18 further comprises a logic AND gate 56. D-tiptops are set by a positive edge of the signal supplied to their clock inputs CK, and are reset by a positive level at their reset inputs RES. Data inputs D of D-tiptops 52 and 54 are connected to a supply voltage Vcc. Clock input CK of first D-tiptop 52 receives the reference signal CK52, indicative of the signal provided by crystal oscillator 26, and clock input CK of second D-tiptop 54 receives a signal CK54, indicative of the output signal of VCO 12. Output Q of first D-tiptop 52 provides a source signal to activate current source 32, whereas output Q of second D-tiptop 54 provides a sink signal to activate current sink 34. AND gate 56 has a first gate input coupled to output Q of first D-tiptop 52, a second gate input coupled to output Q of second D-tiptop 54, and a third gate input coupled to divider 28 to receive a further signal representative of reference signal CK52. A gate output of AND gate 56 is connected to reset inputs RES of both the first and second D-tiptops 52 and 54.

Signal diagrams

FIGS. 3a-3g clarify the operation of discriminator 18 in FIG. 2 for a first example. FIG. 3a shows signal CK52 as a function of time t, and FIG. 3b shows signal CK54 as a function of time t. When a positive edge occurs in CK52, D-flipflop 52 is set and produces Q52 as a logic high as shown in FIG. 3c. Similarly, when a positive edge occurs in CK54, D-tiptop 54 is set and produces Q54 as a logic high as shown in FIG. 3d. Accordingly, when Q52 goes high current source 32 is turned on to supply a current to a pump output 60, and when Q54 goes high current sink 54 is turned on to drain current from pump output 60. The net current I(net) to, and eventual accumulated net charge at, output 60 is proportional to the time interval between the current source and sink being turned on, which is proportional to the phase difference between signals CK52 and CK54. The net current I(net) is shown in FIG. 3e as a function of time t.

As explained above, source 32 and sink 34 both have to be kept turned on and then turned off in a well controlled manner when PLL 10 operates in the near zero-phase-difference region. To this end, a stable control signal is generated to properly reset D-tiptops 52 and 54 through AND gate 56 when both source 32 and sink 34 have been turned on. In order to activate AND gate 56 when both Q52 and Q54 are already high, there is needed a third input signal EN that goes high and is well defined regarding its temporal characteristics. Such a signal is available either directly from crystal oscillator 26, or indirectly via divider 28 or an other intermediate circuit.

FIG. 3f shows the signal XTAL supplied by crystal oscillator 26. Note that signal CK52 is derived from signal XTAL, for instance, by counting fixed numbers of pulses of signal XTAL before a next transition in CK52. Accordingly, the pulses from crystal oscillator 26 provide a highly accurate time base that easily can be adapted to the task envisaged. For example, the same pulses in signal XTAL can be used to generate the third signal EN having opposite polarity. This is shown in FIG. 3g. The associated signal evolution for Q52 and Q54 is shown in FIGS. 3c and 3d.

The example of FIG. 3g is based on a single cycle of signal XTAL whose successive positive edges determine successive transitions in signal EN. Another example could be based on creating a third signal EN based on half a cycle of signal XTAL. This decreases the time during which both sink 34 and source 32 are turned on, since the time during which EN is high is reduced, leading to less noise accumulation at pump output 60 and reduced power dissipation in pump 14. Such a signal EN is derived by means of a simple buffer, e.g. an inverter.

In the examples shown, source 32 is active during a fixed time period, whereas sink 34 is active during a time span depending on the phase difference.

Current peaks in dividers 28 and 30 during normal operation may cause supply voltage modulation and therefore in the temporal behaviour of the switching of source 32 and sink 34. When the signals that control source 32 and sink 34 are modulated in the same way by deriving control signals that are synchronous to the divider operation as in the invention, the modulation effect is reduced. Also, by reducing the action of dividers (or counters) 28 and 30 during signal transmission to charge pump 14 undesired modulation is reduced. This may be accomplished by letting the positive edges of the input signals to dividers 28 and 30 control divider operation and the negative edges of the input signals to dividers 28 and 30 control the phase discriminator.

The above procedure for clock control uses the edges of opposite polarity in the clock signal to control the operation of different circuits on the same chip. This procedure may very well be applied to more general circuitry than to the PLL environment discussed above. It represents an elegant manner to establish a temporal separation of activities to reduce noise generation. Temporal activity distribution may be based on avoiding excessive noise on a clock edge of one polarity by transferring some of the activities to the preceding or succeeding clock edge of the other polarity.

I claim:

1. An electronic circuit with a PLL comprising:
a VCO having an oscillator output for supplying an oscillator output signal and having a control input for control of the VCO;
a charge pump having a current source and a current sink and being operative to provide a control signal to the VCO control input;
a phase discriminator having a first detector input to receive the oscillator output signal and a second detector input to receive a reference signal, the phase discriminator being operative to control the charge pump dependent upon a phase difference between the oscillator output signal and the reference signal, the phase discriminator including:
resettable latch means responsive to the oscillator output signal and to the reference signal and having a first latch output to supply a source signal for control of the current source and a second latch output to supply a sink signal for control of the current sink, and a reset input to receive a reset signal;
reset means operative to generate the reset signal for resetting the latch means upon both the current sink and the current source being kept turned on for a particular time span, the generation of the reset signal involving the sink signal and the source signal; and wherein the reset means is operative to produce the reset signal under direct control of the sink signal, the source signal and the reference signal, but not under direct control of the oscillator output signal.

2. An electronic circuit as claimed in claim 1, wherein the reset means comprises:
a reset logic gate having an output coupled to a reset input of the latch means for providing the reset signal, and having first and second inputs coupled to the first and second latch outputs for controlling said logic gate via the source signal and the sink signal, and having a third input to receive an enable signal representative of the reference signal.

3. The electronic circuit of claim 2, wherein the enable signal is derived from the reference signal through a counter or a divider.

4. The electronic circuit of claim 2, wherein the enable signal is derived from two successive edges of a same polarity in the reference signal.

5. The electronic circuit of claim 2, wherein the enable signal is derived from two successive edges of opposite polarity in the reference signal.

6. The electronic circuit of claim 2, wherein the latch means comprises:
a first D-flipflop having a clock input controlled by the reference signal, a D-input to receive a dc voltage, a reset input to receive the reset signal from the reset logic gate, and a Q-output connected to the first input of the reset logic gate and providing one of the source signal and the sink signal; and
a second D-flipflop having a clock input controlled by the oscillator output signal, a D-input to receive the dc voltage, a reset input to receive the reset signal from the reset logic gate, and a Q-output connected to the second input of the reset logic gate and providing the other of the source signal and the sink signal.

7. The electronic circuit of claim 4, wherein the latch means comprises:
a first D-flipflop having a clock input controlled by the reference signal, a D-input to receive a dc voltage, a reset input to receive the reset signal from the reset logic gate, and a Q-output connected to the first input of the reset logic gate and providing one of the source signal and the sink signal; and
a second D-flipflop having a clock input controlled by the oscillator output signal, a D-input to receive the dc voltage, a reset input to receive the reset signal from the reset logic gate, and a Q-output connected to the second input of the reset logic gate and providing the other of the source signal and the sink signal.

8. A phase discriminator for control of a charge pump including a first detector input to receive a first signal and a second detector input to receive a reference signal, the phase discriminator being operative to provide an output signal dependent upon a phase difference between the first signal and the reference signal, the phase discriminator comprising:
resettable latch means responsive to the first signal and the reference signal and having a first latch output to supply a first output signal and a second latch output to supply a second output signal, and a reset input to receive a reset signal;
reset means operative to generate the reset signal for resetting the latch means upon both the first and second output signals being kept active for a particular time span, the generation of the reset signal involving the first and second output signals; wherein the reset means is operative to produce the reset signal under direct control of the first and second output signals and the reference signal and not under direct control of the first signal.

9. The electronic circuit of claim 5, wherein the latch means comprises:

a first D-flipflop having a clock input controlled by the reference signal, a D-input to receive a dc voltage, a reset input to receive the reset signal from the reset logic gate, and a Q-output connected to the first input of the reset logic gate and providing one of the source signal and the sink signal; and a second D-flipflop having a clock input controlled by the oscillator output signal, a D-input to receive the dc voltage, a reset input to receive the reset signal from the reset logic gate, and a Q-output connected to the second input of the reset logic gate and providing the other of the source signal and the sink signal.

10. The phase discriminator as claimed in claim 8 wherein the reset means comprises:

a reset logic gate having an output coupled to the reset input of the latch means so as to supply the reset signal thereto, and having first and second inputs coupled to the first and second latch outputs for controlling said logic gate via the first output signal and the second output signal, and having a third input to receive an enable signal indicative of the reference signal.

11. The phase discriminator as claimed in claim 10 wherein the enable signal is derived from one of two successive edges of a same polarity of the reference signal and two successive edges of opposite polarity of the reference signal.

12. The phase discriminator as claimed in claim 10 wherein the latch means comprises:

a first D-flipflop having a clock input controlled by the reference signal, a D-input to receive a dc voltage, a reset input to receive the reset signal from the reset logic gate, and a Q-output connected to the first input of the reset logic gate and providing one of the first and second output signals, and a second D-flipflop having a clock input controlled by the first signal, a D-input to receive the dc voltage, a reset input to receive the reset signal from the reset logic gate, and a Q-output connected to the second input of the reset logic gate to provide the other of the first and second output signals.

13. A phase detection circuit comprising:

a first input adapted to receive a first variable frequency signal, a second input adapted to receive a reference signal, output means providing first and second output signals as a function of a phase difference between said first variable frequency signal and said reference signal, a resettable binary circuit responsive to said first variable frequency signal and said reference signal and having first and second outputs to supply said first and second output signals to said output means, and a reset input to receive a reset signal to reset the binary circuit, and reset means for deriving said reset signal to reset the binary circuit only when the first variable frequency signal and the reference signal occur at the same time, said reset means being operative to derive the reset signal under control of said first and second output signals and the reference signal and independently of the first variable frequency signal.

14. The phase detection circuit as claimed in claim 13 wherein the reset means comprise:

gate means having an output coupled to the reset input of the binary circuit to supply the reset signal to said reset input, first and second inputs of the gate means being coupled to said first and second outputs of the binary circuit, respectively, and wherein a third input of the gate means receives an enable signal derived from said reference signal.

15. The phase detection circuit as claimed in claim 13 wherein the binary circuit further comprises:

a first D-flipflop having a clock input controlled by the reference signal, a D-input to receive a dc voltage, a reset input to receive the reset signal, and an output operative as said first output of the binary circuit, and a second D-flipflop having a clock input controlled by the first variable frequency signal, a D-input to receive the dc voltage, a reset input to receive the reset signal, and an output operative as said second output of the binary circuit.

16. The phase detection circuit as claimed in claim 14 wherein said reference signal is supplied by a stable high frequency oscillator and said enable signal is derived from the oscillator reference signal via a frequency divider.

17. The phase detection circuit as claimed in claim 16 wherein the enable signal is derived from one of two successive edges of a same polarity of the reference signal and two successive edges of opposite polarity of the reference signal.

18. The phase detection circuit as claimed in claim 13 wherein said first and second output signals control a voltage controlled oscillator and said first variable frequency signal is derived from an output signal of the voltage controlled oscillator.

19. The phase detection circuit as claimed in claim 14 wherein a single reset signal controls the reset of the binary circuit and said enable signal is derived only from said reference signal.

* * * * *